United States Patent
Kumar et al.

(10) Patent No.: US 10,256,310 B1
(45) Date of Patent: Apr. 9, 2019

(54) SPLIT-GATE FLASH MEMORY CELL HAVING A FLOATING GATE SITUATED IN A CONCAVE TRENCH IN A SEMICONDUCTOR SUBSTRATE

(71) Applicant: Vanguard International Semiconductor Corporation, Hsinchu (TW)

(72) Inventors: Manoj Kumar, Jharkhand (IN); Ankit Kumar, Jharkhand (IN); Chia-Hao Lee, New Taipei (TW); Chih-Cherng Liao, Jhudong Township (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 15/830,662

(22) Filed: Dec. 4, 2017

(51) Int. Cl.
*H01L 29/423* (2006.01)
*H01L 29/49* (2006.01)
(Continued)

(52) U.S. Cl.
CPC .... *H01L 29/42336* (2013.01); *H01L 21/0223* (2013.01); *H01L 21/02164* (2013.01);
(Continued)

(58) Field of Classification Search
CPC ......... H01L 29/42368; H01L 29/42356; H01L 29/42366; H01L 29/42376; H01L 27/115–27/11597; H01L 2924/14511; H01L 29/42324–29/42336; H01L 29/788–29/7889; H01L 2924/1451; H01L 29/66825; H01L 29/42364; G11C 14/0018; G11C 16/04–16/0491; G11C 16/06–16/3495; G11C 27/005;
(Continued)

(56) References Cited

U.S. PATENT DOCUMENTS

| | | | | |
|---|---|---|---|---|
| 5,488,244 A | * | 1/1996 | Quek | ............... H01L 29/42336 257/314 |
| 6,184,086 B1 | * | 2/2001 | Kao | ................. H01L 29/42336 438/259 |
| 7,338,861 B2 | * | 3/2008 | Kim | ..................... H01L 27/115 257/E21.429 |

(Continued)

FOREIGN PATENT DOCUMENTS

TW 201115723 A1 5/2011
TW 201448173 A 12/2014

OTHER PUBLICATIONS

Taiwanese Office Action with Search Report issued in Taiwanese application No. 107101532 dated Dec. 18, 2018.

*Primary Examiner* — Scott B Geyer
(74) *Attorney, Agent, or Firm* — Birch, Stewart, Kolasch & Birch, LLP

(57) ABSTRACT

A split-gate flash memory cell is provided. The split-gate flash memory cell includes a semiconductor substrate having a source region and a drain region. The source region and the drain region are separated by a channel region. The split-gate flash memory cell also includes a concave trench in the semiconductor substrate, a floating gate dielectric lining the concave trench, and a floating gate situated in the concave trench on the floating gate dielectric. The floating gate has a convex bottom surface. The split-gate flash memory cell also includes an inter-gate dielectric on the floating gate, and a control gate on the inter-gate dielectric.

20 Claims, 12 Drawing Sheets

(51) Int. Cl.
*H01L 29/66* (2006.01)
*H01L 21/28* (2006.01)
*H01L 21/02* (2006.01)
*H01L 21/306* (2006.01)
*H01L 21/265* (2006.01)
*H01L 21/266* (2006.01)
*H01L 29/788* (2006.01)

(52) U.S. Cl.
CPC ...... *H01L 21/266* (2013.01); *H01L 21/26513* (2013.01); *H01L 21/28273* (2013.01); *H01L 21/30604* (2013.01); *H01L 29/4916* (2013.01); *H01L 29/66825* (2013.01); *H01L 29/7881* (2013.01); *H01L 21/02255* (2013.01)

(58) Field of Classification Search
CPC .................. G11C 2216/06–2216/10; G11C 2216/12–2216/30; G11C 16/00–16/349
See application file for complete search history.

(56) References Cited

U.S. PATENT DOCUMENTS

| | | | | |
|---|---|---|---|---|
| 7,544,991 B2* | 6/2009 | Kim | .................. | H01L 21/28273 257/316 |
| 7,982,255 B2* | 7/2011 | Abbott | ............. | H01L 21/28273 257/313 |
| 8,614,473 B2* | 12/2013 | Abbott | ............. | H01L 21/28273 257/314 |
| 8,916,912 B2* | 12/2014 | Juengling | ......... | H01L 21/26586 257/230 |
| 2002/0110984 A1* | 8/2002 | Liou | .................... | H01L 27/115 438/259 |
| 2002/0177269 A1* | 11/2002 | Chou | ................ | H01L 21/28273 438/201 |
| 2004/0238852 A1 | 12/2004 | Lee et al. | | |
| 2005/0026372 A1* | 2/2005 | Gonzalez | ......... | H01L 21/28185 438/270 |
| 2006/0121675 A1* | 6/2006 | Kim | ...................... | H01L 27/115 438/264 |
| 2006/0151830 A1* | 7/2006 | Gonzalez | .......... | H01L 21/28185 257/330 |
| 2006/0270186 A1* | 11/2006 | Tsunomura | ....... | H01L 21/28273 438/439 |
| 2010/0320522 A1* | 12/2010 | Ozawa | ............. | H01L 21/28273 257/316 |
| 2015/0255614 A1* | 9/2015 | Nagai | ................ | H01L 29/4236 257/316 |
| 2015/0303207 A1* | 10/2015 | Liu | ................... | H01L 29/42336 257/316 |

* cited by examiner

SPLIT-GATE FLASH MEMORY CELL HAVING A FLOATING GATE SITUATED IN A CONCAVE TRENCH IN A SEMICONDUCTOR SUBSTRATE

BACKGROUND

Embodiments of the present disclosure relate to a flash memory cell, and in particular they relate to a split-gate flash memory cell.

Non-volatile memory devices are widely used in the electronics industry. The data stored in a non-volatile memory can be retained even if the system power is lost. Non-volatile memory can take the form of one-time programmable devices, such as electrically programmable read-only memory (EPROM), or re-programmable devices, such as electrically erasable, programmable read-only memory (EEPROM).

One example of non-volatile memory is flash memory. Flash memories are becoming popular due to their advantages, such as smaller sizes, and less power consumption.

However, existing flash memories have not been satisfactory in every respect (e.g., the programming time needs improving).

SUMMARY

Some embodiments of the present disclosure relate to a split-gate flash memory cell. The split-gate flash memory cell includes a semiconductor substrate having a source region and a drain region. The source region and the drain region are separated by a channel region. The split-gate flash memory cell also includes a concave trench in the semiconductor substrate, a floating gate dielectric lining the concave trench, and a floating gate situated in the concave trench on the floating gate dielectric. The floating gate has a convex bottom surface. The split-gate flash memory cell also includes an inter-gate dielectric on the floating gate, and a control gate on the inter-gate dielectric.

Some embodiments of the present disclosure relate to a method for forming a split-gate flash memory cell. The method includes providing a semiconductor substrate, forming a concave trench in the semiconductor substrate, forming a first dielectric layer on the semiconductor substrate. The first dielectric layer lines the concave trench. The method also includes forming a floating gate layer on the first dielectric layer, forming a mask layer on the floating gate layer. The mask layer has an opening above the concave trench. The method also includes forming a dielectric material to fill the opening, removing the mask layer and a first portion of the floating gate layer under the mask layer, while leaving a second portion of the floating gate layer under the dielectric material to serve as a floating gate. The floating gate is situated in the concave trench on the first dielectric layer. The method also includes forming a second dielectric layer on a sidewall of the floating gate. The floating gate is surrounded by the first dielectric layer, the dielectric material, and the second dielectric layer. The method also includes forming a control gate on the first dielectric layer, the second dielectric layer, and the dielectric material, and forming a source region and a drain region in the semiconductor substrate on opposite sides of the control gate.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
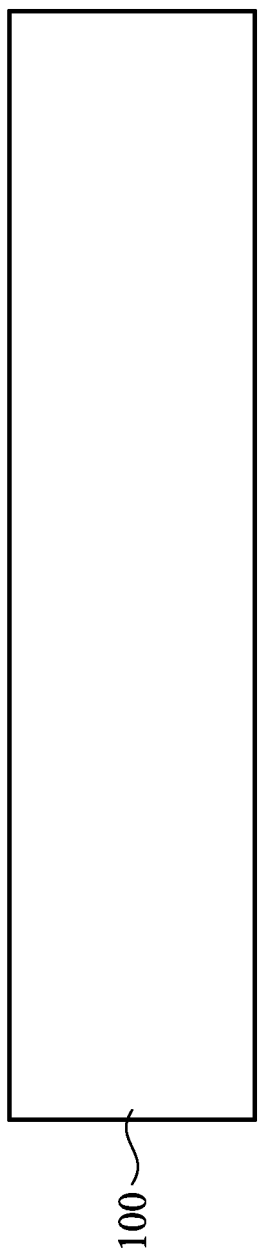
FIGS. 1-11 are a series of cross-sectional views illustrating a method for forming a split-gate flash memory cell according to an embodiment of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Various embodiments of the present disclosure will be discussed below. Like reference numerals may be used to represent like components. It should be understood that additional steps can be implemented before, during, or after the illustrated methods, and some steps might be replaced or omitted in other embodiments of the illustrated methods.

The split-gate flash memory cell according to embodiments of the present disclosure has a concave trench in the semiconductor substrate. The concave trench has tips which may increase the current flow between the semiconductor substrate and the floating gate of the split-gate flash memory cell, and thus the performance of the split-gate flash memory cell may be improved (e.g., reducing the programming or writing time).

FIG. 1 illustrates an initial step of a method for forming a split-gate flash memory cell according to an embodiment of the present disclosure. As shown in FIG. 1, a semiconductor substrate 100 is provided. For example, the semiconductor substrate 100 can include silicon. In some embodiments, the semiconductor substrate 100 can include other elementary semiconductor (e.g., germanium), compound semiconductor (e.g., silicon carbide (SiC), gallium arsenic (GaAs), indium arsenide (InAs), or indium phosphide (InP)), and alloy semiconductor (e.g., silicon germanium (SiGe), silicon germanium carbide (SiGeC), gallium arsenic phosphide (GaAsP), or gallium indium phosphide (GaInP)). In other embodiments, the semiconductor substrate 100 can include a semiconductor-on-insulator (SOI) substrate. The SOI substrate can include a bottom substrate, a buried oxide layer disposed on the bottom substrate, and a semiconductor layer disposed on the buried oxide layer.

In some embodiments, the semiconductor substrate 100 is a p-type silicon substrate. For example, the dopant of the p-type silicon substrate 100 may include boron, aluminum, gallium, indium, other applicable dopants, or a combination thereof, and a dopant concentration of the p-type silicon substrate 100 may be $5 \times 10^{14}$ to $5 \times 10^{16}$ cm$^{-3}$. In other embodiments, the semiconductor substrate 100 may be an n-type silicon substrate. For example, the dopant of the n-type silicon substrate 100 may include arsenic, phosphorus, antimony, other applicable dopants, or a combination thereof, and a dopant concentration of the n-type silicon substrate 100 may be $5\times10^{14}$ to $5\times10^{16}$ cm$^{-3}$. The following embodiments will be described using a p-type silicon substrate 100 as an example, but the present disclosure is not limited thereto.

Figure 2:
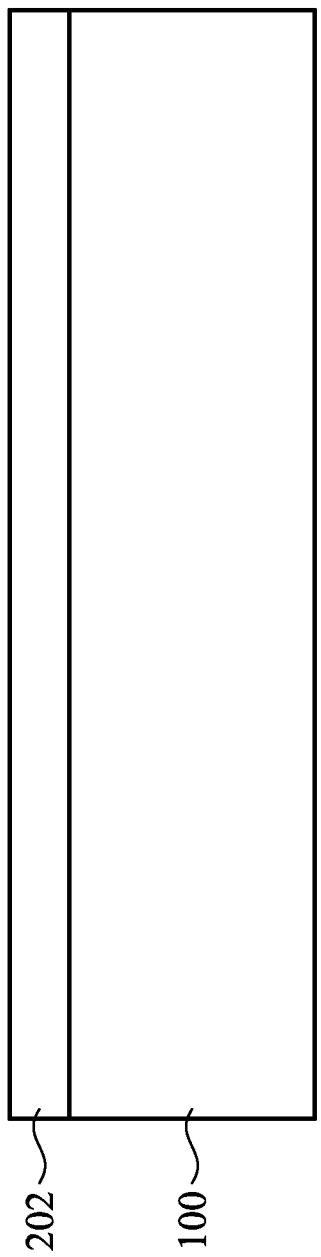

Then, as shown in FIG. 2, a mask layer 202 is formed on the semiconductor substrate 100. In some embodiments, the mask layer 202 can include silicon nitride, silicon oxynitride, other applicable materials, or a combination thereof. In some embodiments, the mask layer 202 may be formed by a low-pressure chemical vapor deposition process (LPCVD), a plasma-enhanced chemical vapor deposition process (PECVD), another applicable process, or a combination thereof. For example, a thickness of the mask layer 202 can be 0.1 to 0.5 μm, but it is not limited thereto.

Figure 3:
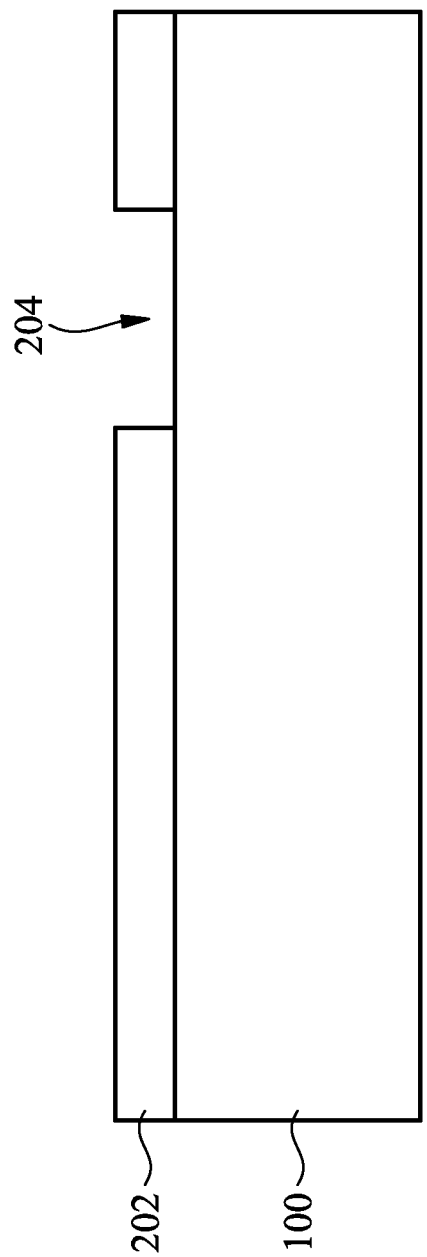

Then, as shown in FIG. 3, an opening 204 is formed in the mask layer 202 by a patterning process. For example, the patterning process can include a lithography process (e.g., photoresist coating, soft baking, mask aligning, exposure, post-exposure baking, developing photoresist, etc. . . . ), an etching process (e.g., wet etching process, dry etching, etc. . . . ), another applicable process, or a combination thereof. In some embodiments, a patterned photoresist layer (not shown) having an opening corresponding to the opening 204 can be formed on the mask layer 202 by a lithography process, and then an etching process can be performed to remove a portion of the mask layer 202 exposed by the opening of the patterned photoresist layer (not shown) to form the opening 204 in the mask layer 202.

Figure 4:
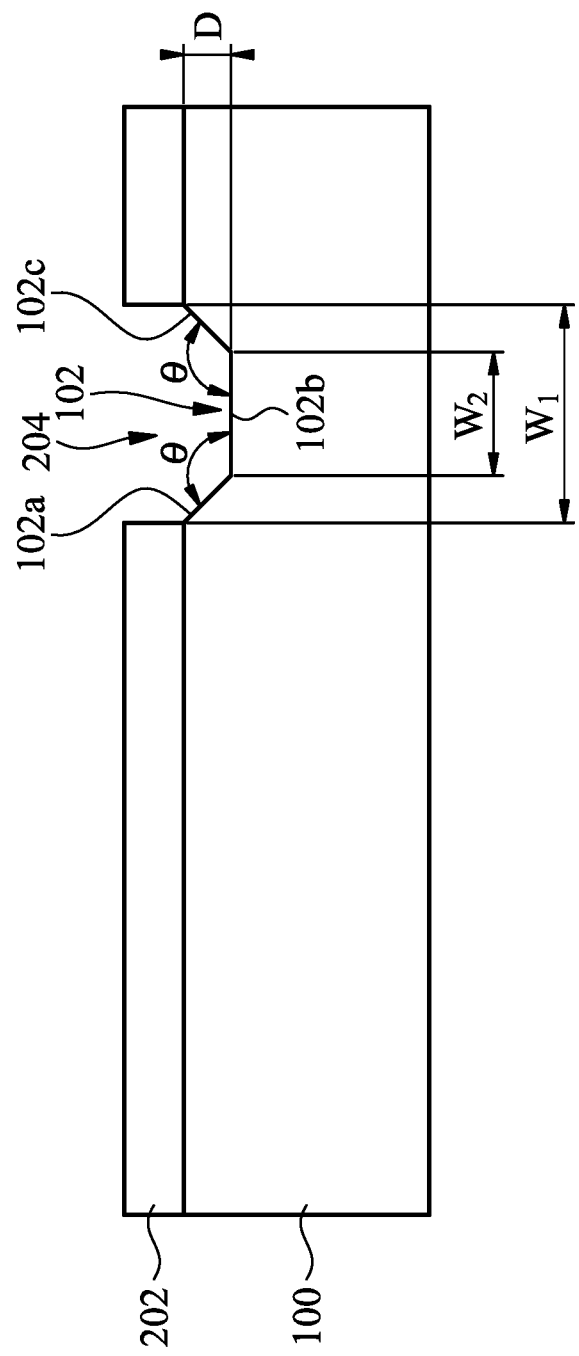

Then, as shown in FIG. 4, a concave trench 102 is formed in the semiconductor substrate 100 under the opening 204. In some embodiments, the concave trench 102 can increase the performance of the split-gate flash memory cell, and the details will be discussed later.

In some embodiments, the concave trench 102 is formed by an etching process (e.g., wet etching process, dry etching, another applicable process, or a combination thereof) using the mask layer 202 as an etch mask. For example, a wet etching process can be performed to form the concave trench 102.

As shown in FIG. 4, the concave trench 102 can have a bottom surface 102b, a sidewall 102a, and a sidewall 102c opposing to the sidewall 102a. In some embodiments, an angle θ between the bottom surface 102b and the sidewall 102a (or the sidewall 102c) of the concave trench 102 can be greater than or equal to 90° and less than or equal to 115°. In the embodiment illustrated, the concave trench 102 is symmetrical (i.e., the angle between the bottom surface 102b and the sidewall 102a being substantially equal to the angle between the bottom surface 102b and the sidewall 102c). However, the angle between the bottom surface 102b and the sidewall 102a may be different from the angle between the bottom surface 102b and the sidewall 102c in other embodiments.

In some embodiments, as shown in FIG. 4, the bottom surface 102b of the concave trench 102 can be substantially parallel to a top surface of the semiconductor substrate 100. The concave trench 102 may have a depth D (i.e., a distance between the bottom surface 102b of the concave trench 102 and the top surface of the semiconductor substrate 100). In some embodiments where the depth D is greater than 2000 Å, the threshold voltage is disadvantageously affected. Therefore, in some other embodiments, the depth D of the concave trench 102 is 500 Å to 2000 Å (i.e., 500 Å≤D≤2000 Å) to achieve a better threshold voltage.

As shown in FIG. 4, the concave trench 102 has a top width $W_1$ and a bottom width $W_2$. In some embodiments, a ratio of $W_1$ to $W_2$ (i.e., $W_1/W_2$) is 1 to 1.3. The ratio of $W_1$ to $W_2$ may depend on the angle θ.

Figure 5:
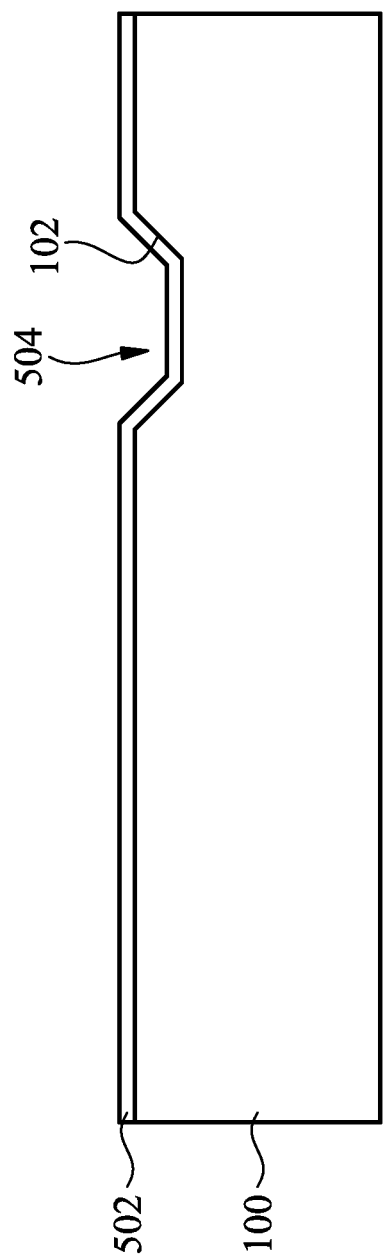

Then, as shown in FIG. 5, the mask layer 202 is removed by an etching process or another applicable process. Then, a first dielectric layer 502 lining the concave trench 102 is formed on the semiconductor substrate 100. In some embodiments, as shown in FIG. 5, the first dielectric layer 502 is conformally formed on the semiconductor substrate 100, and thus the first dielectric layer 502 also has a concave trench 504 corresponding to and above the concave trench 102 of the semiconductor substrate 100. For example, the first dielectric layer 502 can include oxide or other applicable dielectric materials. In some embodiments, the first dielectric layer 502 can be formed by a thermal oxidation process, a chemical vapor deposition process, another applicable process, or a combination thereof. In the embodiment illustrated, the first dielectric layer 502 includes silicon oxide formed by thermal oxidation of the semiconductor substrate 100. For example, the thermal oxidation process can include a dry oxidation process (e.g., $Si+O_2 \rightarrow SiO_2$), a wet oxidation process (e.g., $Si+2H_2O \rightarrow SiO_2+2H_2$), or a combination thereof.

Figure 6:
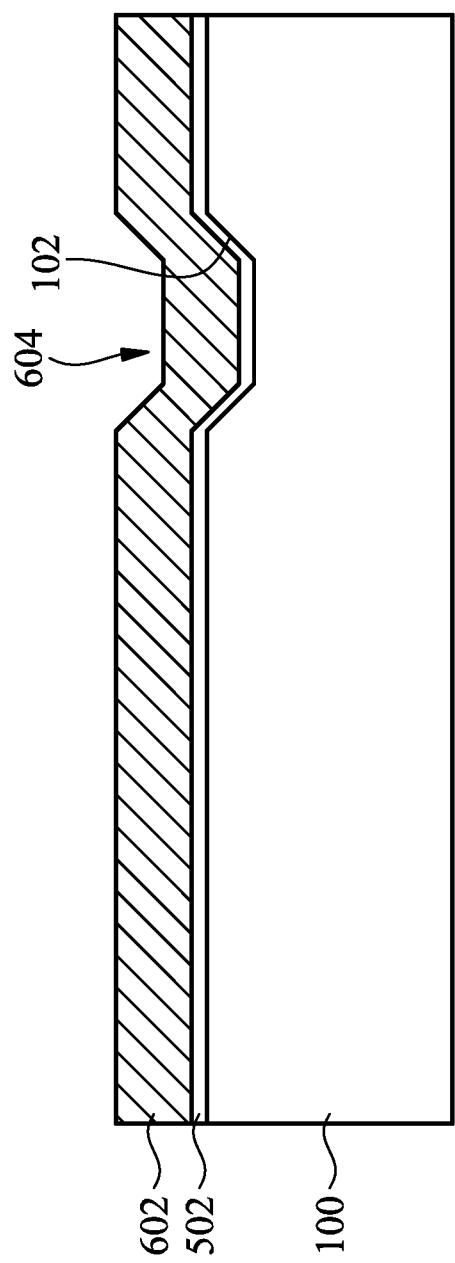

Then, as shown in FIG. 6, a floating gate layer 602 is formed on the first dielectric layer 502. In some embodiments, as shown in FIG. 6, the floating gate layer 602 is conformally formed on the semiconductor substrate 100 and the first dielectric layer 502, and thus the floating gate layer 602 also has a concave trench 604 corresponding to and above the concave trench 102 of the semiconductor substrate 100. In the embodiment illustrated, the floating gate layer 602 includes poly-silicon, but the floating gate layer 602 may include other conductive materials (e.g., metal, metal alloy, polycide (i.e., a combination of poly-silicon and silicide), another applicable conductive material, or a combination thereof) in other embodiments. For example, the floating gate layer 602 can be formed by a chemical vapor deposition process, a low-pressure chemical vapor deposition process, a metal-organic chemical vapor deposition process (MOCVD), another applicable process, or a combination thereof.

Figure 7:
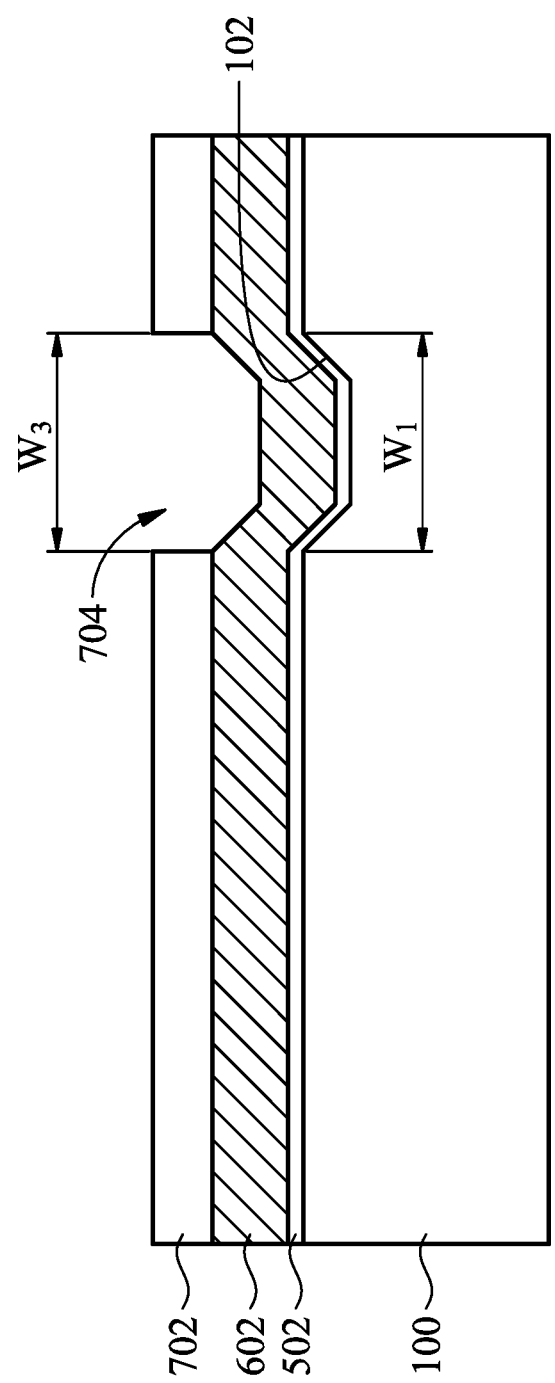

Then, as shown in FIG. 7, a mask layer 702 is formed on the floating gate layer 602, and an opening 704 is formed in the mask layer 702 corresponding to and above the concave trench 102. For example, the mask layer 702 can include silicon nitride, silicon oxynitride, other applicable materials, or a combination thereof. In some embodiments, the mask layer 702 may be formed by a low-pressure chemical vapor deposition process (LPCVD), a plasma-enhanced chemical vapor deposition process (PECVD), another applicable process, or a combination thereof. For example, a thickness of the mask layer 702 can be 0.1 to 0.6 μm, but it is not limited thereto. In some embodiments, the opening 704 can be formed in the mask layer 702 by a patterning process. For example, the patterning process can include a lithography process (e.g., photoresist coating, soft baking, mask aligning, exposure, post-exposure baking, developing photoresist, etc. . . . ), an etching process (e.g., wet etching process, dry etching process, etc. . . . ), another applicable process, or a combination thereof. In some embodiments, a patterned photoresist layer (not shown) having an opening corresponding to the opening 704 can be formed on the mask layer 702 by a lithography process, and then an etching process can be performed to remove a portion of the mask layer 702 exposed by the opening of the patterned photoresist layer (not shown) to form the opening 704 in the mask layer 702.

In some embodiments, the photo mask used in the lithography process for forming the concave trench 102 (or the opening 204) can be used in the lithography process for forming the opening 704 to reduce the manufacturing cost.

As shown in FIG. 7, the opening 704 can be above the concave trench 102 and have a width $W_3$. In the embodiment illustrated, the top width $W_1$ of the concave trench 102 is substantially equal to the width $W_3$ of the opening 704 (e.g., a ratio of $W_1$ to $W_3$ is about 1.0) because same mask is used.

Figure 8:
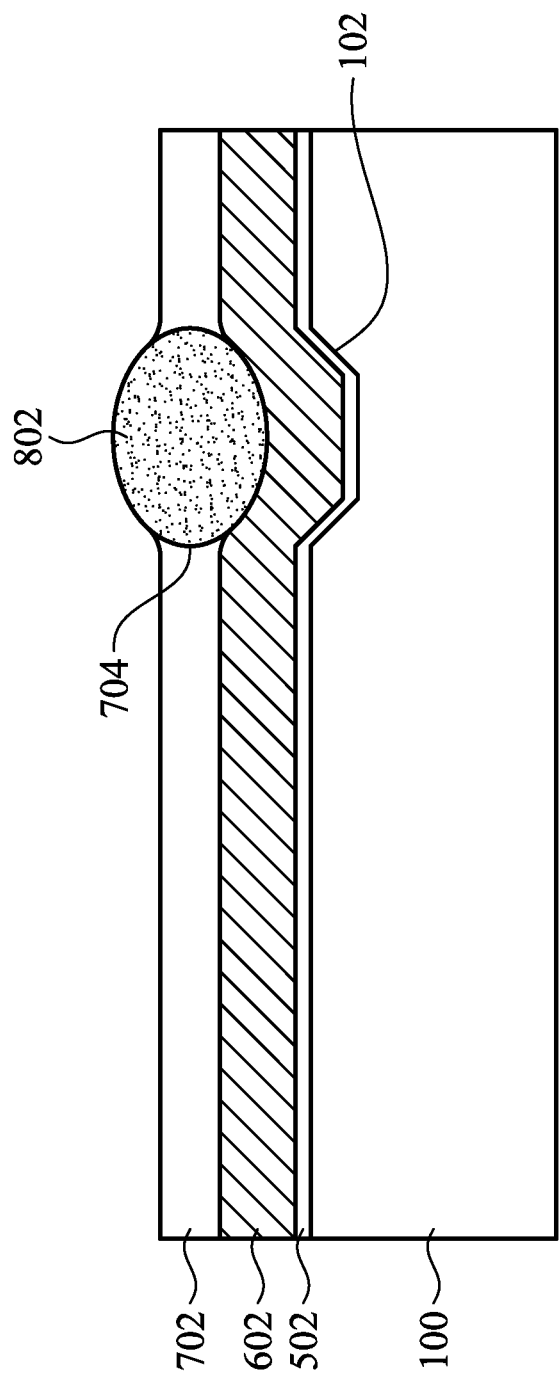

Then, as shown in FIG. 8, a dielectric material 802 is formed to fill the opening 704. The dielectric material 802 will be used as an etch mask in a subsequent process to form a floating gate, and the details will be discussed later. For example, the dielectric material 802 can include oxide or other applicable dielectric materials. In some embodiments, the dielectric material 802 can be formed by a thermal oxidation process, a chemical vapor deposition process, another applicable process, or a combination thereof. In the embodiment illustrated, the dielectric material 802 includes silicon oxide formed by a thermal oxidation process. For example, the thermal oxidation process can include a dry oxidation process, a wet oxidation process, or a combination thereof.

Figure 9:
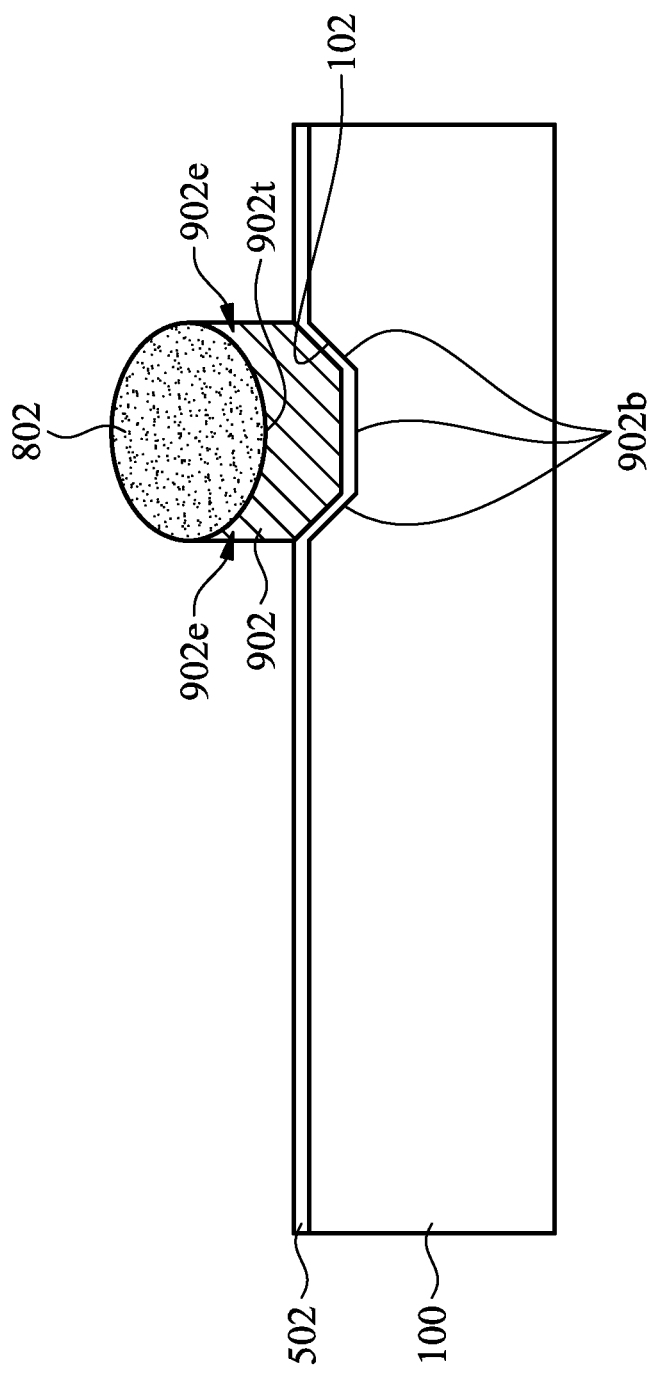

Then, as shown in FIG. 9, the mask layer 702, and a portion of the floating gate layer 602 are removed by an etching process (dry etching process, wet etching process, etc. . . . ) or another applicable process, while a remaining portion of the floating gate layer 602 under the dielectric material 802 can serve as a floating gate 902. In some embodiments, the material of the dielectric material 802 (e.g., silicon oxide) is different from the material of the mask layer 702 (e.g., silicon nitride) and the floating gate layer 602 (e.g., poly-silicon), and thus the dielectric material 802 can be used as an etch mask in the etching process for forming the floating gate 902. As shown in FIG. 9, the floating gate 902 can be conformally formed over the concave trench 102, and the floating gate 902 can have a concave top surface 902t and a convex bottom surface 902b corresponding to the concave trench 102. In some embodiments, the floating gate 902 has a tip profile at top edges 902e, which may improve the performance of the split-gate flash memory cell (e.g., reducing the erasing time).

Figure 10:
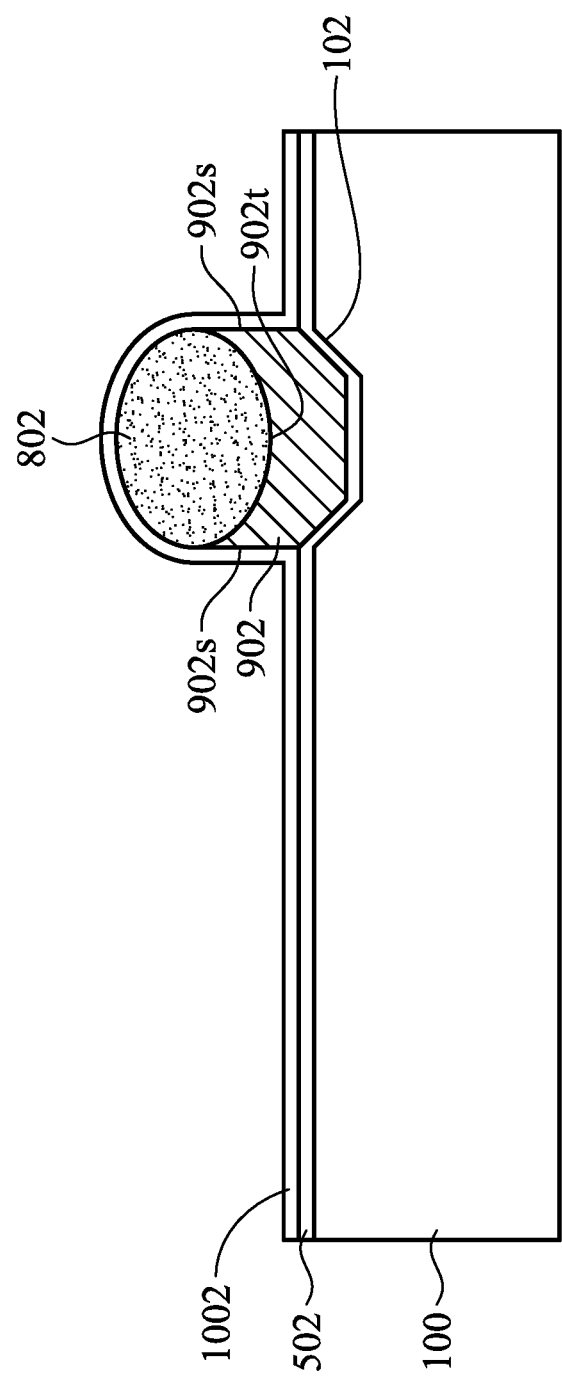

Then, as shown in FIG. 10, a second dielectric layer 1002 is formed on sidewalls 902s of the floating gate 902, the dielectric material 802, and the first dielectric layer 502. For example, a thickness of the second dielectric layer 1002 can be 50 Å to 200 Å. For example, the second dielectric layer 1002 can include oxide or other applicable dielectric materials. In some embodiments, the second dielectric layer 1002 can be formed by a thermal oxidation process, a chemical vapor deposition process, a spin on coating process, an atomic layer deposition process (ALD), another applicable process, or a combination thereof. In the embodiment illustrated, the second dielectric layer 1002 includes silicon oxide formed by thermal oxidation process (e.g., a dry oxidation process, a wet oxidation process, or a combination thereof). In some embodiments, each of the first dielectric layer 502, the dielectric material 802, and the second dielectric layer 1002 includes thermally grown silicon oxide, and there is no observable interface between any two of them.

Figure 11:
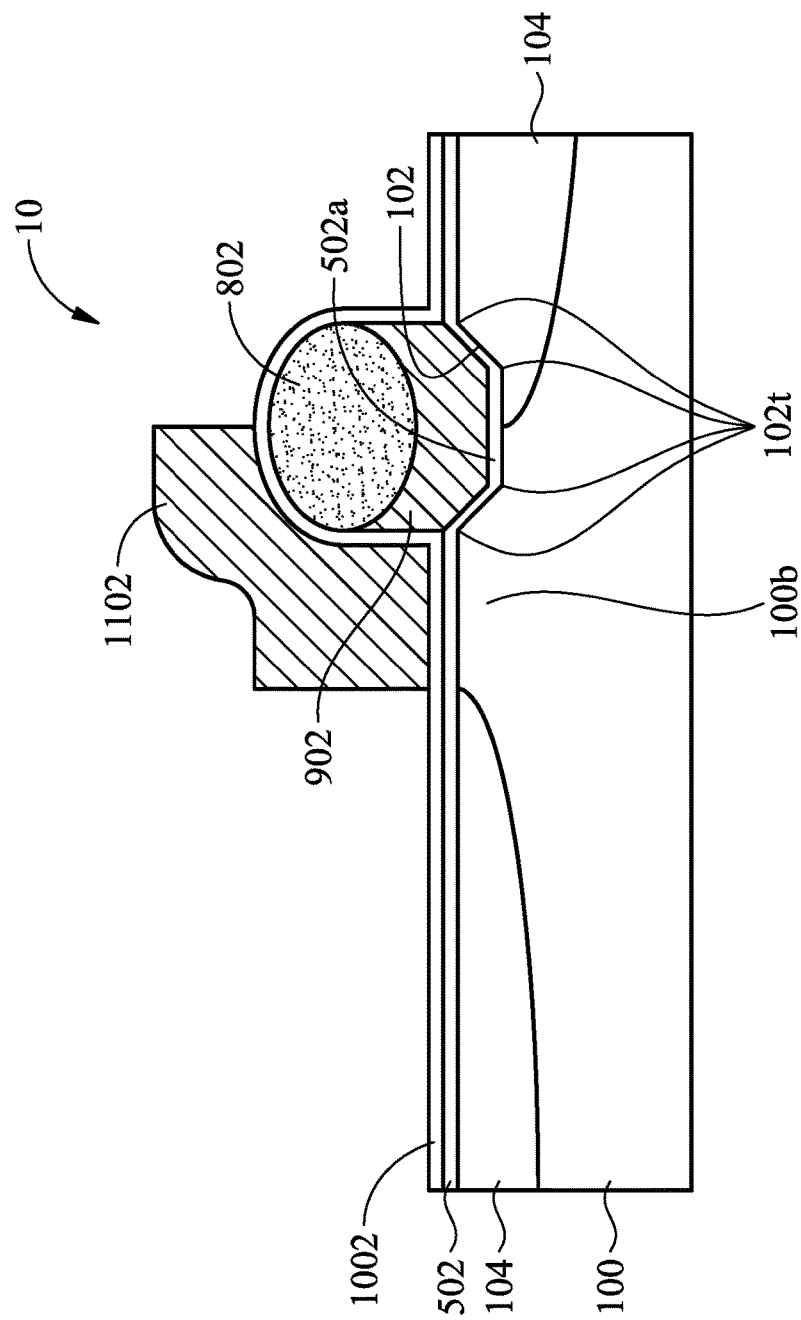

Then, as shown in FIG. 11, a control gate 1102 is formed on the first dielectric layer 502, the dielectric material 802, and the second dielectric layer 1002. In the embodiment illustrated, the control gate 1102 includes poly-silicon, but the control gate 1102 may include other conductive materials (e.g., metal, metal alloy, polycide, etc. . . . ) in other embodiments. For example, the control gate 1102 can be formed by a deposition process (e.g., a chemical vapor deposition process, a low-pressure chemical vapor deposition process, a metal-organic chemical vapor deposition process, etc. . . . ), a patterning process (e.g., a lithography process, an etching process, etc. . . . ), another applicable process, or a combination thereof.

Then, as shown in FIG. 11, source/drain regions 104 can be formed in the semiconductor substrate 100. The source/drain regions 104 can be separated by a channel region 100b in the semiconductor substrate 100 under the control gate 1102. In the embodiment illustrated, the source/drain regions 104 are doped with n-type dopants. For example, the control gate 1102 can be used as a mask in an implantation process to implant phosphorous ions or arsenic ions into the semiconductor substrate 100 on opposite sides of the control gate 1102 to form the source/drain regions 104 having a dopant concentration of $5 \times 17$ cm$^{-3}$ to $5 \times 20$ cm$^{-3}$. In other embodiments, the semiconductor substrate 100 is an n-type silicon substrate, and thus the source/drain regions 104 are doped with p-type dopants (e.g., boron, aluminum, gallium, indium, another applicable dopant, or a combination thereof), and a dopant concentration of the source/drain regions 104 can be $5 \times 17$ cm$^{-3}$ to $5 \times 20$ cm$^{-3}$.

As shown in FIG. 11, a split-gate flash memory cell 10 is formed. The split-gate flash memory cell 10 includes a concave trench 102. In some embodiments, a portion of the first dielectric layer 502 lining the concave trench 102 under the floating gate 902 can serve as a floating gate dielectric 502a (as shown in FIG. 11). In other words, the floating gate 902 can be situated in the concave trench 102 on the floating gate dielectric 502a. In some embodiments, the dielectric material 802 and a portion of the second dielectric layer 1002 between the floating gate 902 and the control gate 1102 can serve as an inter-gate dielectric, and the control gate 1102 can be formed on the inter-gate dielectric.

As shown in FIG. 11, the concave trench 102 has tips (or corners) 102t. In some embodiments, the tips 102t can increase the current flow between the semiconductor substrate 100 and the floating gate 902, and thus the performance of the split-gate flash memory cell 10 can be improved (e.g., reducing the programming time or the writing time).

Figure 12:
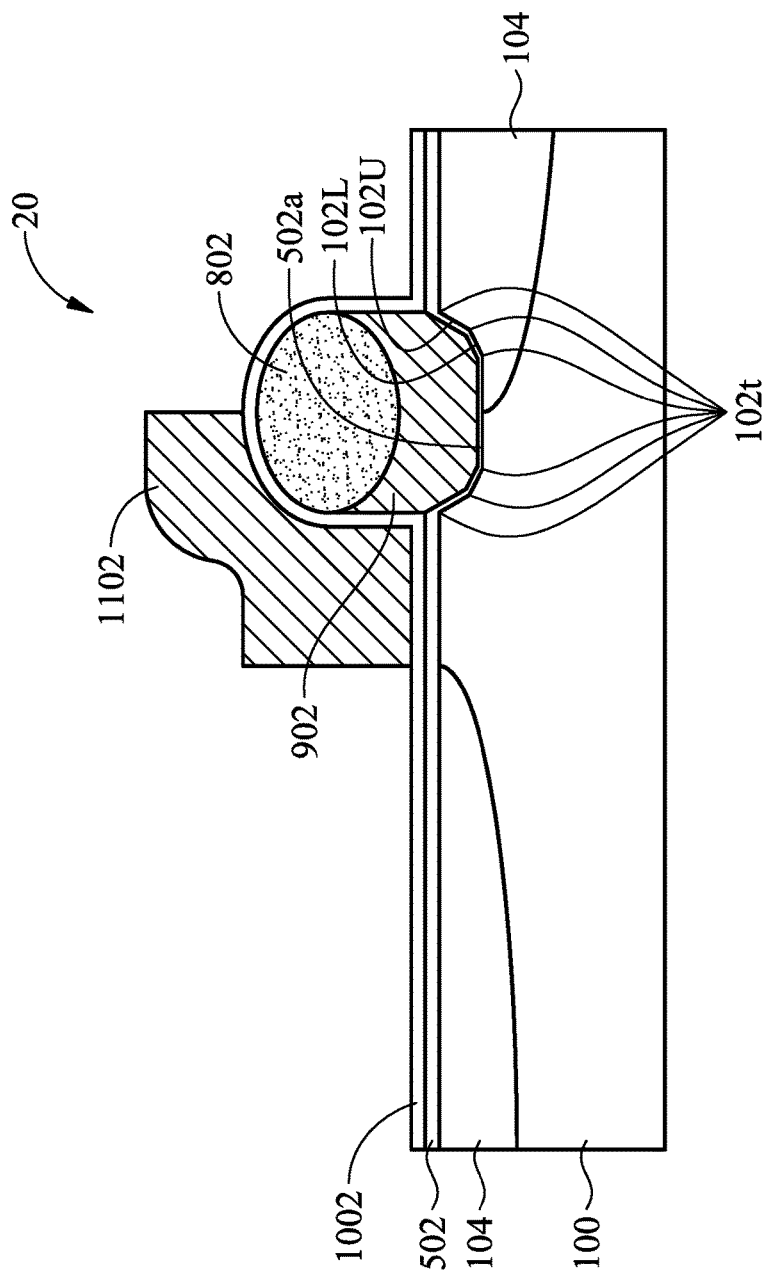
FIG. 12 illustrates a split-gate flash memory cell according to some embodiments of the present disclosure.

FIG. 12 illustrates a split-gate flash memory cell 20 according to some embodiments of the present disclosure. One difference between the split-gate flash memory cell 20 and the split-gate flash memory cell 10 is that the concave trench 102 of the split-gate flash memory cell 20 has an upper portion 102U and a lower portion 102L, and the slope of the sidewall of the upper portion 102U is different from the slope of the sidewall of the lower portion 102L, and thus the concave trench 102 of the split-gate flash memory cell 20 has more tips 102t to further improve the device performance (e.g., reducing the programming time or the writing time).

For example, the step of forming the concave trench 102 of the split-gate flash memory cell 20 can include using a first etch mask having an opening corresponding to the upper portion 102U of the concave trench 102 to perform a first etching process, and then using a second etch mask having an opening corresponding to the lower portion 102L of the concave trench 102 to perform a second etching process. In some embodiments, the etchant of the first etching process can be different from the etchant of the second etching process, and thus the slope of the sidewall of the upper portion 102U can be different from the slope of the sidewall of the lower portion 102L.

In summary, the split-gate flash memory cell of the present disclosure includes a concave trench in the semiconductor substrate under the floating gate. The concave trench has tips which may improve the performance of the split-gate flash memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Furthermore, each claim can be an individual embodiment of the present disclosure, and the scope of the present disclosure includes the combinations of every claim and every embodiment of the present disclosure.

In addition, although some embodiments of the present disclosure are disclosed above, they are not intended to limit the scope of the present disclosure. Furthermore, not all advantages of the embodiments of the present disclosure are discussed. In addition, those skilled in the art may make various changes, substitutions, and alterations herein without departing from the spirit and scope of the embodiments of the present disclosure. Therefore, the scope of protection should be determined by the claims.

What is claimed is:

1. A split-gate flash memory cell, comprising:
   a semiconductor substrate having a source region and a drain region, wherein the source region and the drain region are separated by a channel region;
   a concave trench in the semiconductor substrate;
   a first dielectric layer on the semiconductor substrate, wherein the first dielectric layer has a first portion that is outside the concave trench and on a top surface of the semiconductor substrate, and the first dielectric layer has a second portion that is inside the concave trench and lines the concave trench;
   a floating gate situated in the concave trench on the second portion of the first dielectric layer;
   a dielectric material on the floating gate;
   a second dielectric layer on the first dielectric layer, the floating gate, and the dielectric material, wherein the first portion of the first dielectric layer is between the second dielectric layer and the top surface of the semiconductor substrate; and
   a control gate on the second dielectric layer.

2. The split-gate flash memory cell of claim 1, wherein a depth of the concave trench is in a range between 500 angstrom and 2000 angstrom.

3. The split-gate flash memory cell of claim 1, wherein an angle between a sidewall of the concave trench and a bottom surface of the concave trench is in a range between 90° and 115°.

4. The split-gate flash memory cell of claim 1, wherein each of the first dielectric layer and the second dielectric layer comprises silicon oxide.

5. The split-gate flash memory cell of claim 1, wherein each of the floating gate and the control gate comprises poly-silicon.

6. The split-gate flash memory cell of claim 1, wherein the floating gate has a tip profile at top edges.

7. The split-gate flash memory cell of claim 1, wherein a ratio of a top width of the concave trench to a bottom width of the concave trench will vary in between 1 to 1.3.

8. A method for forming the split-gate flash memory cell of claim 1, comprising:
   providing the semiconductor substrate;
   forming the concave trench in the semiconductor substrate;
   forming the first dielectric layer on the semiconductor substrate, lining the concave trench;
   forming a floating gate layer on the first dielectric layer;
   forming a mask layer on the floating gate layer, wherein the mask layer has an opening above the concave trench;
   forming the dielectric material to fill the opening;
   removing the mask layer and a first portion of the floating gate layer under the mask layer, while leaving a second portion of the floating gate layer under the dielectric material to serve as the floating gate, wherein the floating gate is situated in the concave trench on the first dielectric layer;
   forming the second dielectric layer on the first dielectric layer, the floating gate, and the dielectric material, wherein the floating gate is surrounded by the first dielectric layer, the dielectric material, and the second dielectric layer;
   forming the control gate on the first dielectric layer, the second dielectric layer, and the dielectric material; and
   forming the source region and the drain region in the semiconductor substrate on opposite sides of the control gate.

9. The method for forming a split-gate flash memory cell of claim 8, wherein the dielectric material is formed by a thermal oxidation process.

10. The method for forming a split-gate flash memory cell of claim 8, wherein each of the first dielectric layer, the dielectric material, and the second dielectric layer comprises silicon oxide.

11. The method for forming a split-gate flash memory cell of claim 8, wherein the floating gate is conformally formed over the concave trench, and the floating gate has a concave top surface.

12. The method for forming a split-gate flash memory cell of claim 8, wherein the concave trench is formed by using an etchant to etch the semiconductor substrate.

13. The method for forming a split-gate flash memory cell of claim 8, wherein the step of removing the mask layer and the first portion of the floating gate layer under the mask layer comprises using the dielectric material as an etch mask to perform an etching process.

14. The method for forming a split-gate flash memory cell of claim 8, wherein the floating gate has a convex bottom surface.

15. The method for forming a split-gate flash memory cell of claim 8, wherein the floating gate has a tip profile at top edges.

16. The method for forming a split-gate flash memory cell of claim 8, wherein the concave trench has a depth in a range between 500 angstrom and 2000 angstrom.

17. The method for forming a split-gate flash memory cell of claim 8, wherein an angle between a sidewall of the concave trench and a bottom surface of the concave trench is in a range between 90° and 115°.

18. The method for forming a split-gate flash memory cell of claim 8, wherein the floating gate layer comprises polysilicon.

19. The method for forming a split-gate flash memory cell of claim 8, wherein the step of forming the source region and the drain region in the semiconductor substrate comprises using the control gate as a mask to perform an implantation process.

20. The method for forming a split-gate flash memory cell of claim 8, wherein a top width of the concave trench is substantially equal to a width of the opening.

* * * * *